(12) United States Patent
Yoshida

(10) Patent No.: US 11,774,057 B2
(45) Date of Patent: Oct. 3, 2023

(54) LIGHT EMITTING MODULE

(71) Applicant: NICHIA CORPORATION, Anan (JP)

(72) Inventor: Norimasa Yoshida, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/975,823

(22) Filed: Oct. 28, 2022

(65) Prior Publication Data

US 2023/0051279 A1 Feb. 16, 2023

Related U.S. Application Data

(63) Continuation of application No. 17/710,158, filed on Mar. 31, 2022, now Pat. No. 11,512,827.

(30) Foreign Application Priority Data

Apr. 15, 2021 (JP) ................. 2021-068879

(51) Int. Cl.
*F21S 10/02* (2006.01)
*F21V 9/30* (2018.01)
(Continued)

(52) U.S. Cl.
CPC ............ *F21S 10/026* (2013.01); *F21V 5/007* (2013.01); *F21V 5/045* (2013.01); *F21V 7/0091* (2013.01);
(Continued)

(58) Field of Classification Search
CPC ........ F21S 10/026; F21V 5/007; F21V 5/045; F21V 7/0091; F21V 9/30; F21V 5/04;
(Continued)

(56) References Cited

U.S. PATENT DOCUMENTS

2020/0073207 A1* 3/2020 Okahisa ............ G02B 19/0066
2020/0098735 A1* 3/2020 Tada ..................... F21V 3/0615
(Continued)

FOREIGN PATENT DOCUMENTS

CN     103081144 A    5/2013
JP     2013-004477 A  1/2013
(Continued)

OTHER PUBLICATIONS

English Translation of JP-2013004477-A, Luminaire, Fukano (Year: 2013).*

(Continued)

*Primary Examiner* — Jong-Suk (James) Lee
*Assistant Examiner* — Glenn Zimmerman
(74) *Attorney, Agent, or Firm* — Foley & Lardner LLP

(57) ABSTRACT

A light emitting module includes: a substrate; a first light source mounted on the substrate, the first light source comprising a first light emitting element configured to emit first light, a light reflecting member surrounding lateral faces of the first light emitting element, and a first wavelength conversion member configured to convert a wavelength of a portion of the first light and to emit second light, such that the first light source is configured to output light that includes the first light and the second light, the first wavelength conversion member covering the first light emitting element and extending out from the lateral faces of the first light emitting element when viewed from above; and a first lens on which the light output from the first light source is incident.

13 Claims, 11 Drawing Sheets

(51) Int. Cl.
*F21V 5/00* (2018.01)
*F21V 5/04* (2006.01)
*F21V 7/00* (2006.01)
*F21Y 115/10* (2016.01)
*H01L 25/13* (2006.01)
*H01L 33/50* (2010.01)
*H01L 33/60* (2010.01)

(52) U.S. Cl.
CPC .............. *F21V 9/30* (2018.02); *F21Y 2115/10* (2016.08); *H01L 25/13* (2013.01); *H01L 33/505* (2013.01); *H01L 33/60* (2013.01)

(58) Field of Classification Search
CPC . F21V 17/02; F21V 9/40; F21V 14/06; F21Y 2115/10; H01L 25/13; H01L 33/505; H01L 33/60; H01L 25/0753; H01L 33/504; H01L 33/58; G03B 15/05
See application file for complete search history.

(56) References Cited

U.S. PATENT DOCUMENTS

2020/0132259 A1* 4/2020 Shima ................ G02B 19/0066
2020/0343422 A1* 10/2020 Yamamoto ............ H01L 33/502

FOREIGN PATENT DOCUMENTS

| JP | 2013004477 A | * | 1/2013 |
| JP | 2016-162497 A | | 9/2016 |
| JP | 2018-081748 A | | 5/2018 |
| WO | WO-2010/084187 A1 | | 7/2010 |

OTHER PUBLICATIONS

Notice of Allowance on U.S. Appl. No. 17/710,158 dated Aug. 4, 2022.

* cited by examiner

LIGHT EMITTING MODULE

CROSS-REFERENCE TO RELATED APPLICATION

This application is a continuation of U.S. patent application Ser. No. 17/710,158, filed on Mar. 31, 2022, which claims priority to Japanese Patent Application No. 2021-068879, filed on Apr. 15, 2021. The disclosures of these applications are hereby incorporated by reference in their entireties.

BACKGROUND

Certain embodiments of the present disclosure relate to light emitting modules.

A light emitting module equipped with a light source, which has a light emitting element and a wavelength conversion member, and a lens on which the light from the light source becomes incident has been known. See, for example, Japanese Patent Publication No. 2013-4477.

SUMMARY

One of the objects of the embodiments of the present disclosure described below is to provide a light emitting module capable of varying the chromaticity of outgoing light.

A light emitting module according to one embodiment includes: a first light source having a first light emitting element emitting first light and a first wavelength conversion member converting the wavelength of a portion of the first light and emitting second light to output light that includes the first light and the second light; a first lens on which the emitted light from the first light source becomes incident; a drive unit changing the distance between the first lens and the first light source; a second light source emitting light having different chromaticity from the chromaticity of the emitted light from the first light source; and a second lens on which the emitted light from the second light source becomes incident, wherein the amount of the outgoing second light from the first lens is varied by changing the distance between the first lens and the first light source.

According to an embodiment of the present disclosure, a light emitting module can change the chromaticity of the outgoing light.

DETAILED DESCRIPTION

In the present specification, an XYZ orthogonal coordinate system will be employed for explanation purposes. For example, the direction from the first light source 110 to the first lens 120 in FIG. 1 will be referred to as the "Z direction." The Z direction is also referred to as the "upward direction." The direction opposite to the Z direction will be referred to as the "downward direction." One of the directions orthogonal to the Z direction will be referred to as the "X direction." The direction orthogonal to both the Z and X directions will be referred to as the "Y direction." In the present specification, a cross section showing only an end face might be used as a cross-sectional view.

First Embodiment

A first embodiment will be explained.

Figure 1:
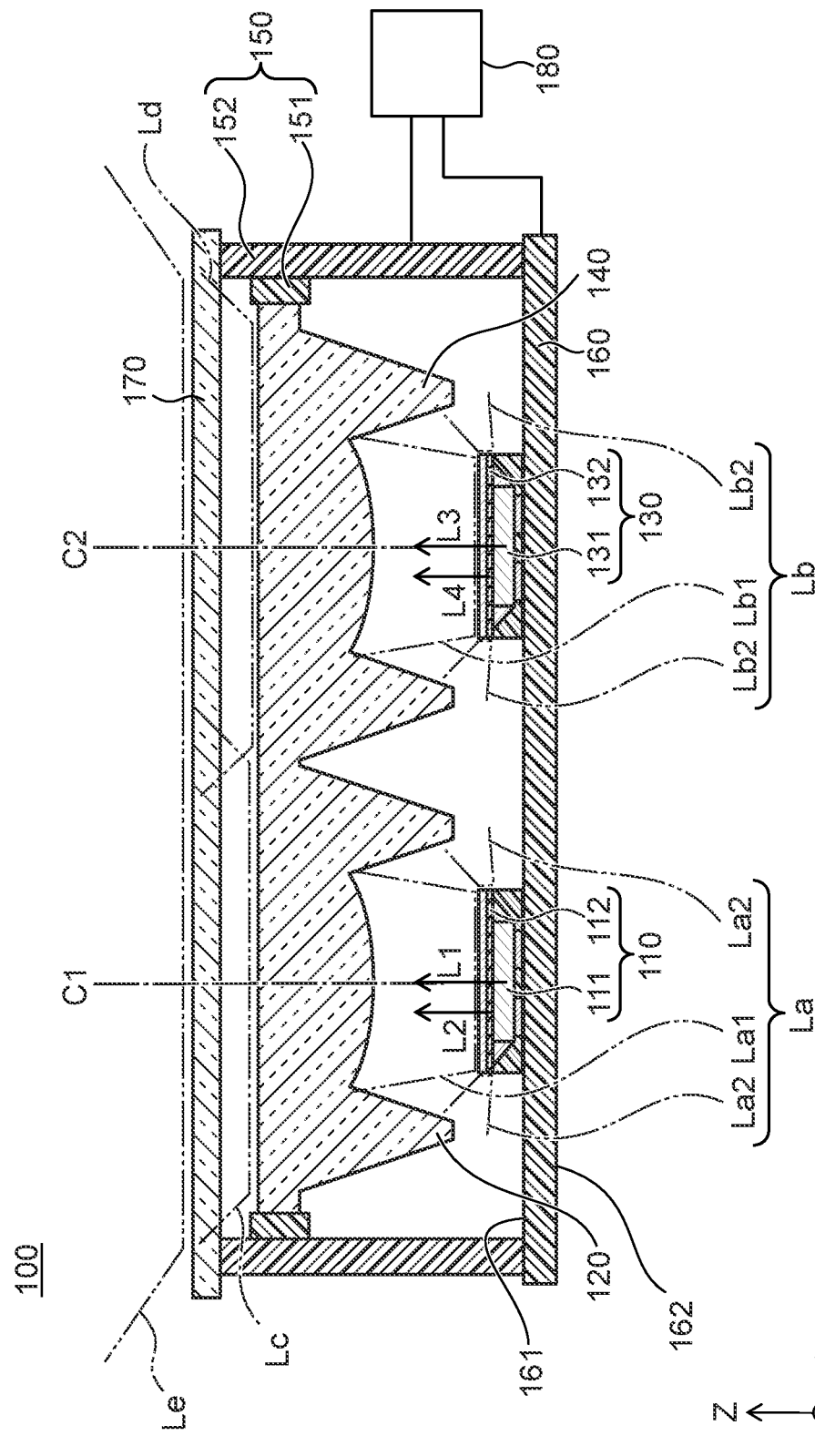
FIG. 1 is a cross-sectional view schematically showing a light emitting module according to a first embodiment.

FIG. 1 is an end face view of a light emitting module according to this embodiment.

Figure 2A:
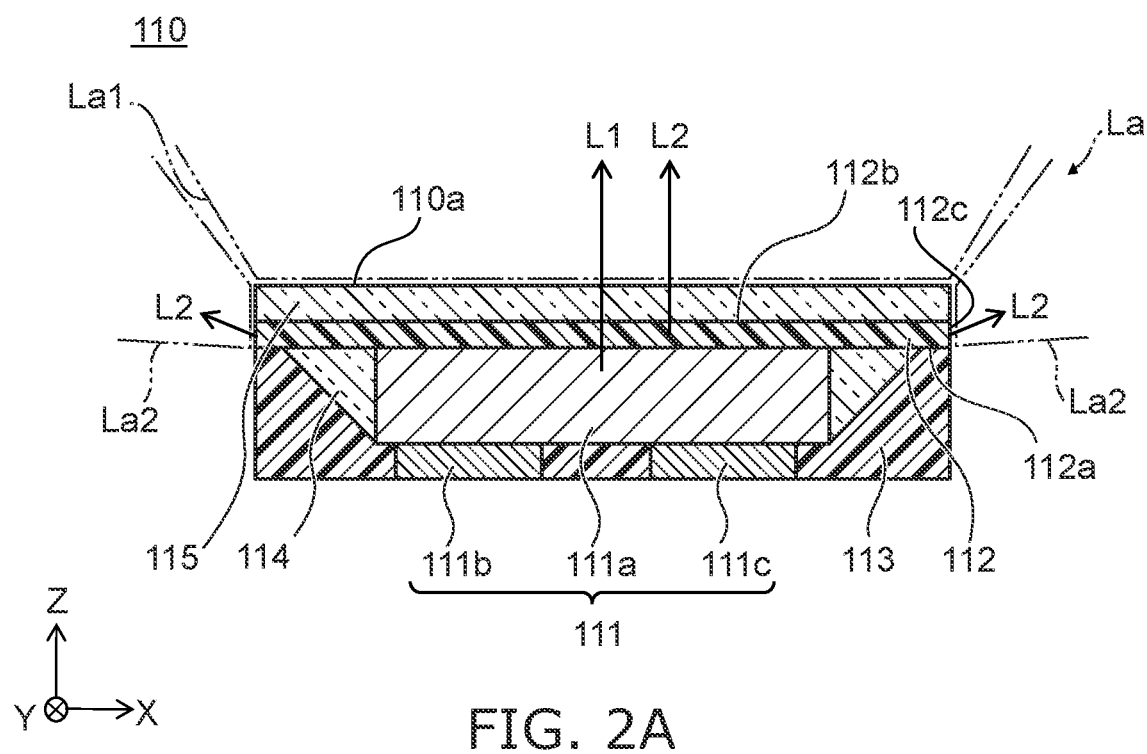
FIG. 2A is a cross-sectional view schematically showing a first light source in the light emitting module according to the first embodiment.

FIG. 2A is an end face view of a first light source in the light emitting module according to this embodiment.

Figure 2B:
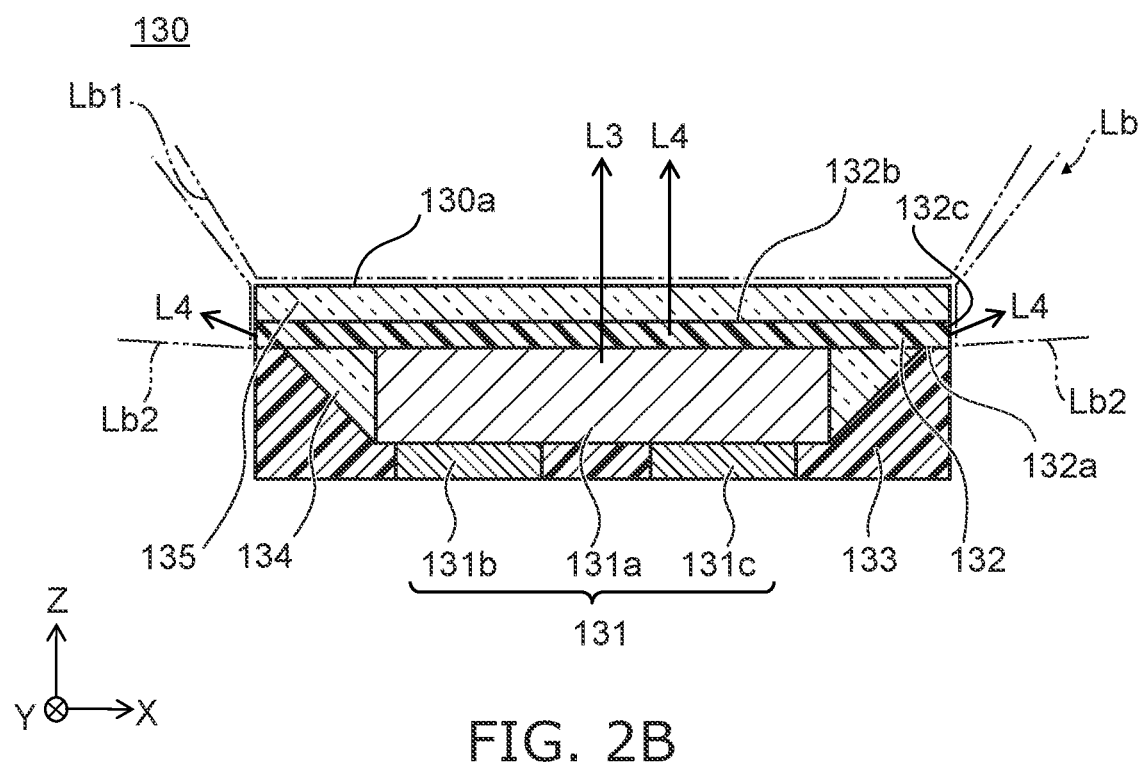
FIG. 2B is a cross-sectional view schematically showing a second light source in the light emitting module according to the first embodiment.

FIG. 2B is a cross-sectional view schematically showing a second light source in the light emitting module according to this embodiment.

Figure 3:
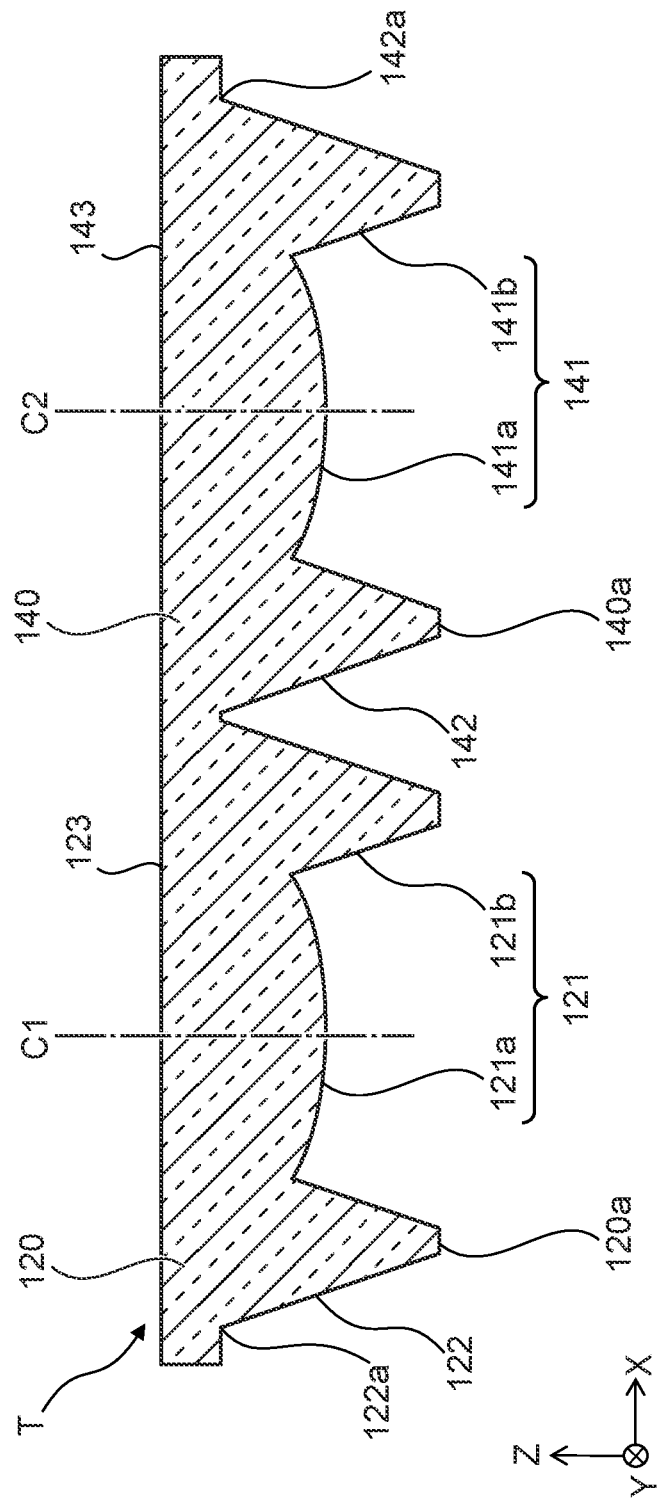
FIG. 3 is a cross-sectional view schematically showing a first lens and a second lens in the light emitting module according to the first embodiment.

FIG. 3 is an end face view of the first lens and the second lens in the light emitting module according to this embodiment.

A light emitting module 100 according to this embodiment, as shown in FIG. 1, includes a first light source 110, a first lens 120, a second light source 130, a second lens 140, and a drive unit 150. As shown in FIG. 3, the first lens 120 and the second lens 140 are integrally formed, for example, using a single light transmissive member T. The first lens 120 and the second lens 140 may be separate parts.

A first light source 110, as shown in FIG. 1, has a first light emitting element 111 that emits first light L1, and a first wavelength conversion member 112 that converts the wavelength of a portion of the first light L1 and emits second light L2. The first light source 110 emits light La that includes the first light L1 and the second light L2. The outgoing light La from the first light source 110 becomes incident on the first lens 120.

A second light source 130 emits light Lb having different chromaticity from that of the outgoing light La from the first light source 110. "The light Lb having different chromaticity from that of the light La" means that the chromaticity measured differs when each of the first light source 110 and the second light source 130 is lit by itself. For example, in this embodiment, the chromaticity of the light La that passes the center of the first light source 110 when viewed from above and measured on the axis C1 paralleling the Z direction differs from the chromaticity of the light Lb that passes the center of the second light source 130 when viewed from above and measured on the axis C2 paralleling the Z direction. The outgoing light Lb from the second light source 130 becomes incident on the second lens 140.

A drive unit 150 changes the distance between the first lens 120 and the first light source 110. This allows the light emitting module 100 to change the amount of the second light L2 exiting the first lens 120. The light emitting module 100 can change the chromaticity of the light Lc that exits the first lens 120 by varying the amount of the second light L2 exiting the first lens 120. In other words, the light emitting module 100 can change the chromaticity of the light Lc that exits the first lens 120 by varying the distance between the first lens 120 and the first light source 110. Here, the "distance between the first lens 120 and the first light source 110" means the shortest distance between the surfaces of the first lens 120 and the first light source 110 that oppose one another in the Z direction, for example, the shortest distance between the surfaces of the first lens 120 and the first light source 110 that oppose one another on the axis C1.

The light emitting module 100 may further include a substrate 160, a diffusion sheet 170, and a control unit 180. The first light source 110 and the second light source 130 are mounted on the substrate 160. The diffusion sheet 170 diffuses and externally releases the outgoing light Lc from the first lens 120 and the outgoing light Ld from the second lens 140. The control unit 180 controls the operations of the first light source 110, the second light source 130, and the drive unit 150. Each constituent of the light emitting module 100 will be described in detail below.

Substrate

A substrate 160 is, for example, a wiring board made of an insulation base material such as a resin in or on which wiring to be connected to the first light source 110 and the second light source 130 is provided.

The surfaces of the substrate 160 include an upper face 161 and a lower face 162 positioned opposite the upper face 161. The upper face 161 and the lower face 162 are flat, for example, substantially in parallel with the X and Y directions. The first light source 110 and the second light source 130 are mounted on the upper face 161. The first light source 110 and the second light source 130 are arranged in the X direction. The light emitting module 100 according to this embodiment has two light sources: the first light source 110 and the second light source 130. The light emitting module, however, may include three or more light sources that emit light of different chromaticity from one another. It may include multiple first light sources 110 and/or second light sources 130.

First Light Source

A first light source 110, as shown in FIG. 2A, has a first light emitting element 111, a first wavelength conversion member 112, a light reflecting member 113, a light guide 114, and a light transmitting member 115. The outgoing light from the first light source 110 includes first light L1 emitted by the first light emitting element 111 and second light L2 that is a portion of the first light L1 whose wavelength has been converted by the first wavelength conversion member 112.

A first light emitting element 111 has, for example, a semiconductor stack 111a that includes an emission layer, and positive and negative electrodes 111b and 111c. The first light emitting element 111 is, for example, a light emitting diode that emits first light L1. The first light emitting element 111 includes, as the semiconductor stack 111a, $In_xAl_yGa_{1-x-y}N$ (0≤x, 0≤y, x+y<1), and can emit visible light or ultraviolet light.

The first light L1 is, for example, blue light. The chromaticity of the first light L1 in terms of the xy chromaticity coordinate system in a CIE 1931 color space, for example, falls within the ranges 0.11≤x≤0.15 and 0.04≤y≤0.11, in the area enclosed by the spectral locus. Hereinafter, the xy chromaticity coordinate system in the CIE 1931 color space will simply be referred to as the "chromaticity coordinate system."

A first wavelength conversion member 112 is disposed on the upper face, a main emission face, of the first light emitting element 111. The first wavelength conversion member 112 absorbs the outgoing first light L1 from the first light emitting element and can emit second light L2 having a different wavelength from that of the first light. The first wavelength conversion member 112 can transmit a portion of the first light L1 without converting the wavelength. For example, in the emission spectrum of the first light source, the peak emission intensity of the second light L2 is 1/3 to 1/1 of the peak emission intensity of the first light. The second light L2 is, for example, yellow light. The chromaticity coordinates of the second light L2 in the chromaticity coordinate system are, for example, 0.35≤x≤0.50 and 0.50≤y≤0.65 within the area enclosed by the spectral locus.

The first wavelength conversion member 112 includes, for example, a light transmissive material as a base material and particles of a phosphor as a wavelength conversion substance. For the light transmissive material, an inorganic material, such as glass, ceramic, or the like, a resin, such as a silicone resin, modified silicone resin, epoxy resin, modified epoxy resin, or the like, can be used. For the phosphor, for example, yttrium aluminum garnet based phosphors (e.g., $Y_3(Al, Ga)_5O_{12}$:Ce), lutetium aluminum garnet based phosphors (e.g., $Lu_3(Al,Ga)_5O_{12}$:Ce), terbium aluminum garnet based phosphors (e.g., $Tb_3(Al,Ga)_5O_{12}$:Ce), CCA-based phosphors (e.g., $Ca_{10}(PO_4)_6Cl_2$:Eu), SAE-based phosphors (e.g., $Sr_4Al_{14}O_{25}$:Eu), chlorosilicate based phosphors (e.g., $Ca_8MgSi_4O_{16}Cl_2$:Eu), nitride based phosphors, such as β-SiAlON based phosphors (e.g., $(Si,Al)_3(O,N)_4$:Eu), α-SiAlON based phosphors (e.g., $Ca(Si,Al)_{12}(O,N)_{16}$:Eu), SLA based phosphors (e.g., $SrLiAl_3N_4$:Eu), CASN-based phosphors (e.g., $CaAlSiN_3$:Eu), or SCASN-based phosphors (e.g., $(Sr,Ca)AlSiN_3$:Eu), fluoride based phosphors, such as KSF-based phosphors (e.g., $K_2SiF_6$:Mn), KSAF-based phosphors (e.g., $K_2(Si,Al)F_6$:Mn), or MGF-based phosphors (e.g., $3.5MgO·0.5MgF_2·GeO_2$:MN), phosphors having a Perovskite structure (e.g., $CsPb(F,Cl,Br,I)_3$), or quantum dot phosphors (e.g., CdSe, InP, $AgInS_2$ or $AgInSe_2$) can be used. An example of a phosphor that absorbs blue light and emits yellow light is a YAG based phosphor.

The first wavelength conversion member 112 covers the first light emitting element 111 as well as extending out from the lateral faces of the first light emitting element 111 when viewed from above. The first wavelength conversion member 112 is, for example, sheet shaped. The surfaces of the first wavelength conversion member 112 include, for example, a lower face 112a, an upper face 112b, and lateral faces 112c.

The first wavelength conversion member 112 is disposed so as to oppose the lower face 112a to the main emission face (i.e, the upper face) of the first light emitting element 111. The upper face 112b of the first wavelength conversion member 112 is positioned opposite the lower face 112a. The lower face 112a and the upper face 112b are flat and substantially in parallel with one another, for example. The lateral faces 112c are positioned between the lower face 112a and the upper face 112b. The lower face 112a of the first wavelength conversion member 112 covers the main emission face of the first light emitting element 111 as well as extending out from the lateral faces of the first light emitting element 111 when viewed from above.

The first wavelength conversion member 112 preferably has a constant thickness (i.e., the dimension in the Z direction). In other words, it is preferable that the thickness of the first wavelength conversion member 112 is substantially the same at any position in the X and Y directions. However, the thickness of the first wavelength conversion member 112 does not necessarily have to be constant, and can differ in part. In the present specification, a "constant thickness" or the "same thickness" does not mean that the thickness is strictly constant or the same, but can include manufacturing tolerances, i.e., the thickness can simply be substantially constant or the same.

A light guide 114 covers the lateral faces of the first light emitting element 111. The light guide 114 extends from the lateral faces of the first light emitting element 111 to cover the lower face 112a of the first wavelength conversion member. The light guide 114 has light transmissivity. The light guide 114 may be disposed between the first wavelength conversion member 112 and the first light emitting element 111 as a bonding material for bonding the two. For the material for use as the light guide 114, a light transmissive resin such as a silicone resin can be used.

A light reflecting member 113 surrounds the lateral faces of the first light emitting element 111. Specifically, the light reflecting member 113 covers the light guide 114 that covers the lateral faces of the first light emitting element 111. The inner lateral faces of the light reflecting member 113 that surrounds the first light emitting element 111 are oblique to the Z direction to be more distant from the first light emitting element 111 in the Z direction. The first wavelength conversion member 112 covers the upper faces of the first light emitting element 111 and the light reflecting member 113. The light reflecting member may cover the lateral faces of the first wavelength conversion member 112 and the lateral faces of the light transmitting member 115. In this case, the light reflecting member 113 makes up a portion of the upper face of the first light source 110.

The light reflecting member 113 is, for example, a resin that contains a light reflecting substance. Examples of such a resin include those listed as the resins that can be used as the first wavelength conversion member 112. Among all, a silicone resin that is highly heat resistant and light resistant is preferably used.

For the light reflecting substance, a material that hardly absorbs the light from the light emitting element and having a large refractive index difference from that of the resin material is preferably used. Examples of such a light reflecting substance include titanium oxide, zinc oxide, silicon oxide, zirconium oxide, yttrium oxide, yttria-stabilized zirconia, potassium titanate, aluminum oxide, aluminum nitride, boron nitride, mullite, and the like. These light reflecting substances can be included in the resin to fall within the 5 mass percent to 90 mass percent range.

A light transmitting member 115 covers the upper face of the first wavelength conversion member. The light transmitting member 115 transmits at least 60%, preferably at least 90%, of the first light L1 and the second light L2. For the light transmitting member 115, a light transmissive resin can be used. Examples of such s light transmissive resin include those listed for use as the first wavelength conversion member 112.

The first wavelength conversion member 112, the light guide 114, and the light transmitting member 115 may contain a light diffuser. Examples of light diffusers include microparticles of silicon oxide, titanium oxide, aluminum oxide, zinc oxide, or the like.

The outgoing light La from the first light source 110 includes, for example, frontal light La1 exiting upward from the first light source 110 and lateral light La2 spreading to the sides of first light source 110. For example, the frontal light La1 is the light that exits near the center of the upper face 110a of the first light source 110, and the lateral light La2 is the light that exits near the perimeter of the upper face 110a and/or the lateral faces of the first light source 110. In the first light source 110, because the frontal light La1 and the lateral light La2 have different chromaticity, the chromaticity of the outgoing light La from the first light source 110 detected would vary depending on the angle at which it is measured. For example, the frontal light La1 and the lateral light La2 are white light having different correlated color temperatures.

The frontal light La1 is a mixture of the first light L1, which passes through the first wavelength conversion member 112 and the light transmitting member 115 before exiting the upper face 110a without undergoing wavelength conversion, and the second light L2, which undergoes wavelength conversion by the first wavelength conversion member 112 and passes through the light transmitting member 115 before exiting the upper face 110a. The color of the frontal light La1 is, for example, daylight white having a correlated color temperature of 5700 K to 7100 K. The chromaticity coordinates of the frontal light La1, for example, fall within the ranges $0.29 \leq x \leq 0.34$ and $0.29 \leq y \leq 0.40$, in the chromaticity coordinate system.

The longer the distance of passage of the first light L1 through the first wavelength conversion member 112, the greater degree of wavelength conversion results. For example, the lateral light La2 that diagonally passes through the first wavelength conversion member 112 before exiting near the perimeter of the first wavelength conversion member 112 has a smaller proportion of the first light L1 to the second light L2 as compared to the frontal light La1. Accordingly, the chromaticity of the lateral light La2 would be closer to that of the second light L2 than that of the frontal light La1. The color of the lateral light La2 is, for example, white light having a correlated color temperature of 3800 K to 4500 K. The chromaticity coordinates of the lateral light La2 in the chromaticity coordinate system, for example, fall within the ranges $0.335 \leq x \leq 0.41$ and $0.32 \leq y \leq 0.44$.

The structure of the first light source 110 is not limited to that described above. The first light source 110 can simply be constructed to output mixed color light composed of the first light L1 emitted by the light emitting element 111 and the second light L2 that is a portion of the first light whose wavelength has been converted by the first wavelength conversion member 112 in which the chromaticity of the frontal light La1 differs from that of the lateral light La2.

Second Light Source

A second light source 130, as shown in FIG. 2B, has a second light emitting element 131, a second wavelength conversion member 132, a light reflecting member 133, a light guide 134, and a light transmitting member 135. The second light source 130 primarily outputs fourth light L4 that is the third light L3 emitted by the second light emitting element 131 whose wavelength has been converted by the second wavelength conversion member 132.

A second light emitting element 131 is, for example, a light emitting diode, and has, similar to the first light emitting element 111, a semiconductor stack 131a which includes an emission layer, and positive and negative electrodes 131b and 131c. The second light emitting element 131 emits third light L3. The third light L3 is, for example, blue light. An example of the chromaticity coordinates of the third light L3 in the chromaticity coordinate system fall within the same ranges as those of the first light L1 described above, for example.

A second wavelength conversion member 132 absorbs the third light L3 emitted by the second light emitting element and outputs fourth light L4 having a different wavelength from that of the third light L3. The thickness and the phosphor concentration of the second wavelength conversion member 132 are adjusted such that the wavelength of the vast majority of the third light incident on the second wavelength conversion member 132 is converted into the fourth light L4. For example, in the emission spectrum of the second light source 130, the peak emission intensity of the third light L3 is no more than ½ of the peak emission intensity of the fourth light L4. The color of the fourth light L4 is, for example, yellowish to reddish amber. The chromaticity coordinates of the fourth light L4 in the chromaticity coordinate system, for example, fall within the area enclosed by the spectral locus; $0.55 \leq x \leq 0.65$ and $0.35 \leq y \leq 0.45$.

The second wavelength conversion member 132, similar to the first wavelength conversion member 112, has a light transmissive material as a base material and particles of a phosphor as a wavelength conversion substance. Examples of light transmissive materials and phosphors for use in the second wavelength conversion member 132 include those listed as the materials for use in the first wavelength conversion member 112. For the phosphor contained in the second wavelength conversion member 132, for example, a combination of phosphors that absorb blue light and emit yellowish and/or reddish light can be used. Specific examples of yellowish light emitting phosphors include YAG based phosphors, and reddish light emitting phosphors include nitride based phosphors. The amount of the wavelength conversion substance contained in the second wavelength conversion member 132 is preferably higher than the wavelength conversion substance content of the first wavelength conversion member 112, for example.

The second wavelength conversion member 132, similar to the first wavelength conversion member 112, is sheet shaped, for example. The surfaces of the second wavelength conversion member 132 include, for example, a lower face 132a, an upper face 132b, and lateral faces 132c.

The second wavelength conversion member 132 is disposed so as to oppose the lower face 132a to the main emission face of the second light emitting element 131. The upper face 132b of the second wavelength conversion member 132 is positioned opposite the lower face 132a in the Z direction. The lower face 132a and the upper face 132b are flat and substantially in parallel with the upper face 161 of the substrate 160, for example. The lateral faces 132c are positioned between the lower face 132a and the upper face 132b. The lower face 132a of the second wavelength conversion member 132 covers the main emission face of the second light emitting element 131 as well as extending out from the lateral faces of the second light emitting element 131 when viewed from above.

The second wavelength conversion member 132, similar to the first wavelength conversion member 112, preferably has a constant thickness (the dimension in the Z direction). However, the thickness of the second wavelength conversion member 132 does not necessarily have to be constant, and can vary in part.

The light reflecting member 133, the light guide 134, and the light transmitting member 135 can be constructed in a similar manner to the light reflecting member 133, the light guide 114, and the light transmitting member 115 in the first light source.

The thickness of the second wavelength conversion member 132 in the second light source 130 is preferably set larger than the thickness of the first wavelength conversion member in the first light source 110, for example. This can convert the wavelength of a larger amount of the light that passes through the second wavelength conversion member 132. In this case, adjusting the thickness of the light transmitting member 135 in the second light source 130 to be smaller than the thickness of the light transmitting member 115 in the first light source 110 can make the height of the first light source 110 and the height of the second light source 130 from the upper face 161 of the substrate 160 in the light emitting module 100 to be equivalent.

The outgoing light Lb from the second light source 130 includes, for example, frontal light Lb1 exiting near the center of the upper face 130a and lateral light Lb2 exiting near the perimeter of the upper face 130a of the second light source 130. The outgoing light from the second light source 130 in which the proportion of the fourth light L4 is large has a small chromaticity difference between the light Lb1 and the light Lb2, making it difficult to visually recognize any chromaticity difference in the outgoing light La of the second light source 130 based on the measurement angle.

The outgoing light Lb from the second light source 130 is a mixture of the third light L3 that passes through the second wavelength conversion member 132 and the light transmitting member 135 before exiting the upper face 130a of the second light source 130 and the fourth light L4 that passes through the light transmitting member 135 before exiting the upper face 130a. As described above, the proportion of the third light, which passes through the second wavelength conversion member without undergoing wavelength conversion, in the outgoing light Lb from the second light source 130 is small. This hardly creates a difference in the chromaticity between the frontal light Lb1 and the lateral light Lb2. The frontal light Lb1 and the lateral light Lb2 are, for example, incandescent white light resulting from mixing, for example, blue third light L3 and amber fourth light L4. The chromaticity coordinates of the frontal light Lb1 and the lateral light Lb2 in the chromaticity coordinate system, for example, fall within the ranges $0.38 \leq x \leq 0.55$ and $0.35 \leq y \leq 0.45$.

The frontal light Lb1 and the lateral light Lb2 of the second light source 130 may be structured to have different correlated color temperatures as in the case of the first light source 110. The outgoing light Lb from the second light source 130 may substantially be composed only of the fourth light L4 without including the third light L3. As such, the structure of the second light source 130 is not limited to that described above, and the structure can simply be such that the chromaticity of the outgoing light Lb differs from the chromaticity of the outgoing light La from the first light source 110.

The forms of the first light source and the second light source are not limited to those described above. For example, at least one of the light guide, the light reflecting member, and the light transmitting member may be missing from the first light source and the second light source. In the case of not disposing light guides covering the lateral faces of the light emitting elements in the first light source and the second light source, the wavelength conversion members may cover the lateral faces in addition to the upper faces of the light emitting elements. In the case of not disposing light guides covering the lateral faces of the light emitting elements in the first light source nor the second light source, the light reflecting members may cover the lateral faces of the light emitting elements.

First Lens and Second Lens

As shown in FIG. 3, the surfaces of a first lens 120 include a first face 121, a second face 122, and a third face 123. The first face 121 is the incident face on which the outgoing light La from the first light source 110 becomes incident. The first face 121 includes, for example, a first region 121a that opposes the upper face 110a of the first light source 110 and a second region 121b disposed in the periphery of and to surround the first region 121a. Specifically, the first lens 120 includes an annular protrusion 120a that surrounds the first region 121a, and the second region 121b is located at the protrusion 120a. The first region 121a, for example, is a curved face protruding downward. The second region 121b is, for example, is oblique so as to become more distant from the axis C1 towards the bottom (i.e., towards the first light source).

The second face 122 is a reflecting face that reflects at least a portion of the light La that is incident on the first face 121. The second face 122 is provided around the first face 121. The second face 122 is, for example, oblique to approach the axis C1 towards the bottom.

The third face 123 is an output face that allows at least a portion of the light La incident on the first face 121 to exit. The third face 123 is positioned opposite the first face 121. The third face 123 is, for example, a flat face that is substantially in parallel with the upper face 161 of the substrate 160.

A second lens 140 is integrally formed with the first lens 120. The surfaces of the second lens 140 include, for example, a first face 141, a second face 142, and a third face 143. The first face 141, the second face 142, and the third face 143 in the second lens 140 can be formed similar to the first face 121, the second face 122, and the third face 123 in the first lens 120. The third face 123 of the first lens 120 is continuous with and coplanar to the third face 143 of the second lens 140.

Figure 4A:
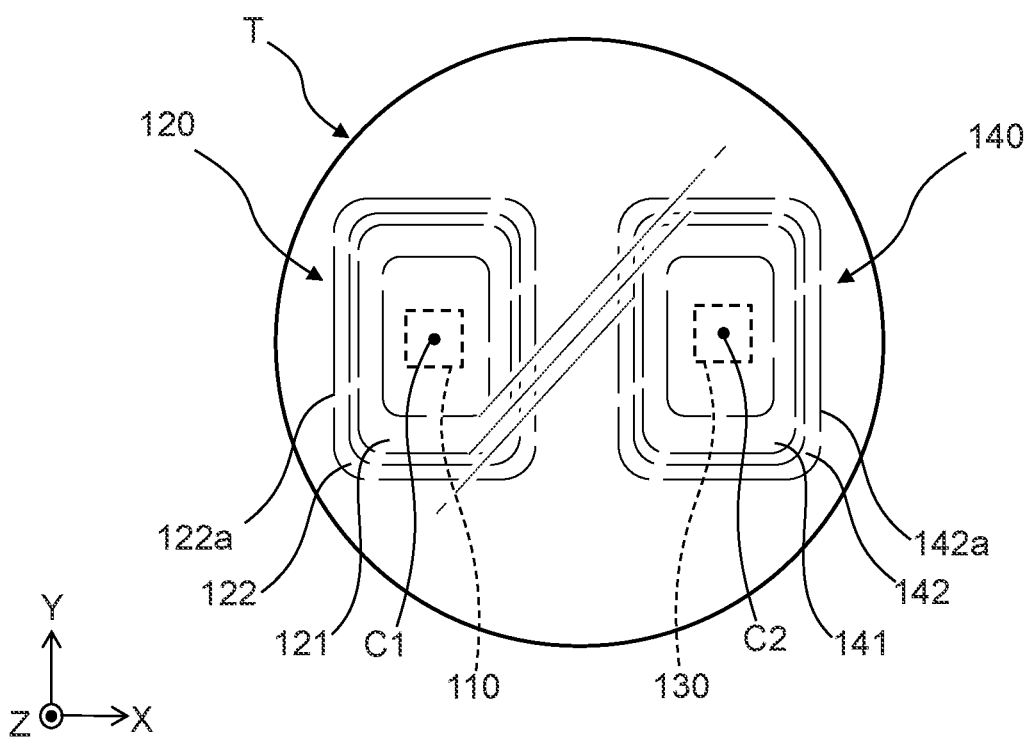
FIG. 4A is a top view schematically showing examples of first and second lenses.

FIG. 4A is a top view showing an example of a light transmissive member T that includes the first and second lenses.

Figure 4B:
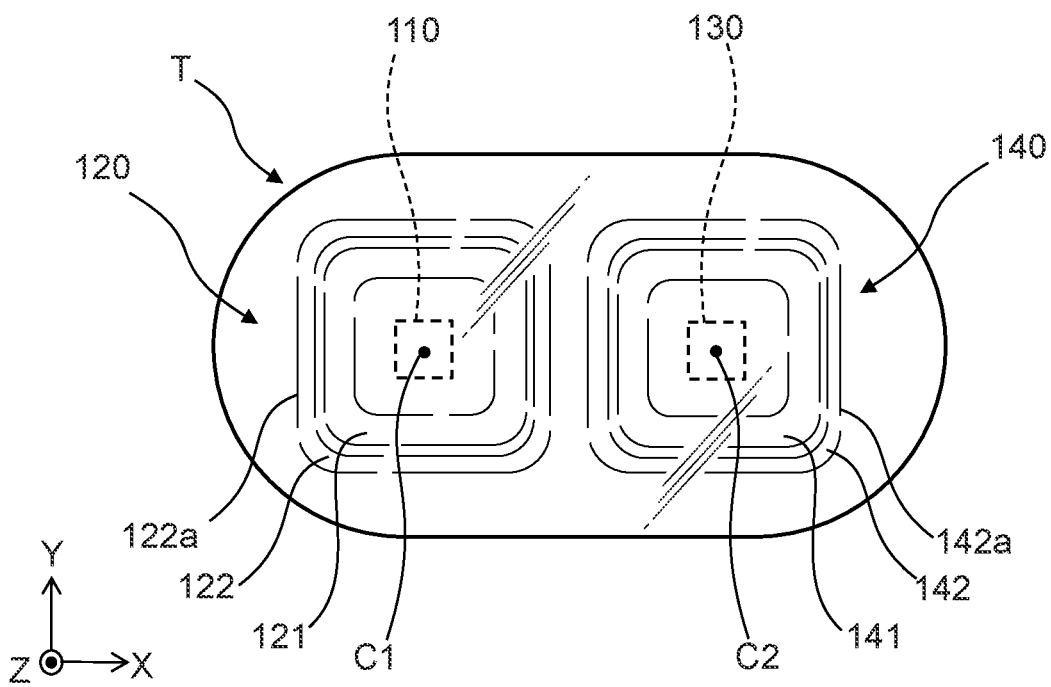
FIG. 4B is a top view schematically showing examples of first and second lenses.

FIG. 4B is a top view showing another example of a light transmissive member T that includes the first and second lenses.

As shown in FIG. 4A and FIG. 4B, the shapes of the outlines 122a and 142a of the second faces 122 and 142 when viewed from above are substantially quadrangular with rounded corners. The axis C1 is positioned at the intersection of the diagonal lines of the outline 122a. Similarly, the axis C2 is positioned at the intersection of the diagonal lines of the outline 142a. When viewed from above, the shape of the light transmissive member T may be circular as shown in FIG. 4A or substantially elliptical as shown in FIG. 4B.

Drive Unit

A drive unit 150 can, for example, move the first lens 120 and the second lens 140 up and down, as shown in FIG. 1. The drive unit 150 has, for example, a holder 151 that holds the first lens 120 and the second lens 140, and a guide 152 that guides the up and down movement of the holder 151. The guide 152 extends up and down, and the lower end of the guide 152 is fixed to the substrate 160, for example. The holder 151 is moved up and down along the guide 152 by a motor that is not shown in the drawing.

The drive unit 150 may be structured to move the holder 150 by using a magnetic force instead of motor power. The drive unit 150 may change the distance between the first lens 120 and the first light source 110 by moving the first light source 110 instead of the first lens 120. In this case, the holder may be constructed to hold the substrate 160 on which the first light source 110 is mounted.

Figure 5:
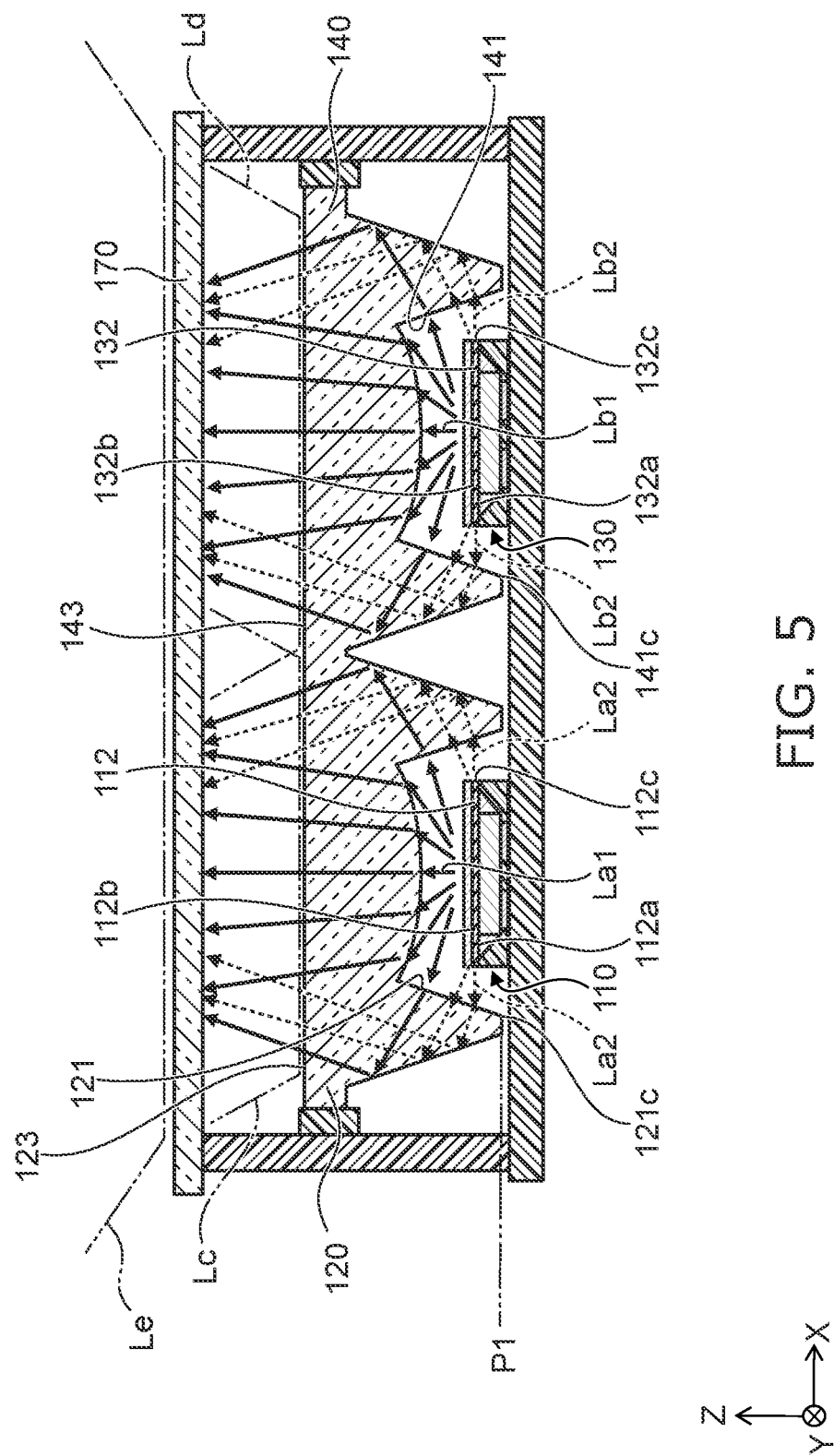
FIG. 5 is a schematic diagram showing the paths of light when the first and second lenses are at a first position.

FIG. 5 is a schematic diagram showing the paths of light when the first and second lenses are at a first position.

Figure 6:
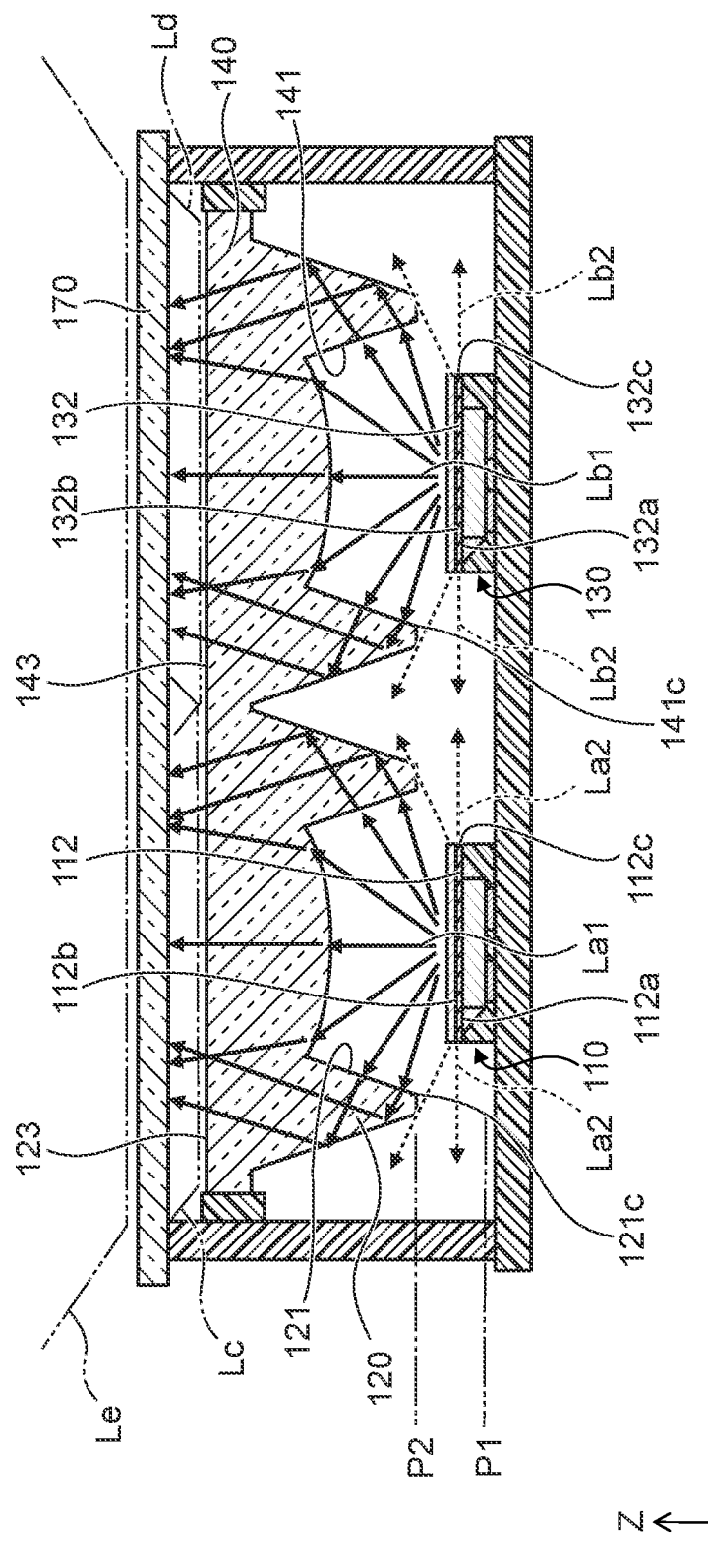
FIG. 6 is a schematic diagram showing the paths of light when the first and second lenses are at a second position.

FIG. 6 is a schematic diagram showing the paths of light when the first and second lenses are at a second position.

In FIG. 5 and FIG. 6, for clarity of explanation, the frontal light La1 and Lb1 are indicated by sold lines, and the lateral light La2 and Lb2 are indicated by broken lines.

The drive unit 150 can move the first lens 120 to a first position P1 (see FIG. 5), and a second position P2 (see FIG. 6) at which the distance between the first lens 120 and the first light source 110 is greater than at the first position P1.

As show in FIG. 5, at the first position P1, a portion of the first face 121, the incident face, of the first lens 120 is positioned laterally outward of and surrounding the first wavelength conversion member 112. Furthermore, a portion of the first face 141, the incident face, of the second lens 140 is positioned laterally outward of and surrounding the second wavelength conversion member 132. At this point, the position of the lower end 121c of the first face 121 may be lower than the lower face 112a of the first wavelength conversion member 112. Furthermore, the position of the lower end 141c of the first face 141 in the Z direction may be lower than the lower face 132a of the second wavelength conversion member 132.

When the first light source 110 is turned on at the first position P1, both the frontal light La1 and the lateral light La2 become incident on the first face 121 of the first lens. Accordingly, the outgoing light Lc from the first lens 120 is a mixture of the daylight white frontal light La1 and more yellowish white lateral light La2 than the frontal light La1, for example, resulting in natural white light having a cor-related color temperature of 5500 K. When the second light source 130 is turned on, moreover, both the frontal light Lb1 and the lateral light Lb2 become incident on the first face 141 of the second lens. Accordingly, the outgoing light Ld from the second lens 140 is a mixture of the frontal light Lb1 and the lateral light Lb2, which is, for example, incandescent white light.

As shown in FIG. 6, at the second position P2, the position of the lower end 121c of the first face 121 of the first lens 120 is, for example, higher than the upper face 112b of the first wavelength conversion member 112. Furthermore, the position of the lower end 141c of the second face 141 of the second lens 140 is higher than the upper face 132b of the second wavelength conversion member 132.

When the first light source 110 is turned on at the second position P2, the amount of the lateral light La2 incident on the first face 121 of the first lens 120 is reduced as compared to the case at the first position P1, or no lateral light La2 becomes incident on the first face 121 of the first lens 120. Accordingly, the color of the outgoing light Lc from the first lens 120 is roughly the same as the color of the frontal light La1, for example, daylight white having a correlated color temperature of 6500 K.

As such, the drive unit 150 changes the distance between the first lens 120 and the first light source 110 and the distance between the second lens 140 and the second light source 130 by moving the first lens 120 and the second lens 140. This can change the chromaticity of the outgoing light Lc from first lens 120.

Diffusion Sheet

A diffusion sheet 170 covers the third face 123 of the first lens 120 and the third face 143 of the second lens 140. The diffusion sheet 170 diffuses and transmits the incident light. The diffusion sheet 170 can diffuse light by having micro-protrusions and micro-indentations on the surfaces, or materials of different refractive indices dispersed therein. The diffusion sheet 170 can reduce the color nonuniformity in the outgoing light Le from the light emitting module 100. The diffusion sheet 170 is attached to the upper end of the guide 152 of the drive unit 150, for example.

Control Unit

A control unit 180 controls the operations of the first light source 110, the second light source 130, and the drive unit 150. The control unit 180 has, for example, a CPU (central processing unit), memory, and the like.

The control unit 180 can independently control the output of the first light emitting element 111 in the first light source 110 and the output of the second light emitting element 131 in the second light source 130. "Controlling an output" includes turning on and off, and adjusting the output of each of the light emitting elements 111 and 131. The control unit 180 also controls the drive unit 150 to move the first lens 120 and the second lens 140 up and down.

Next, the operation of the light emitting module 100 according to this embodiment will be explained.

Figure 7:
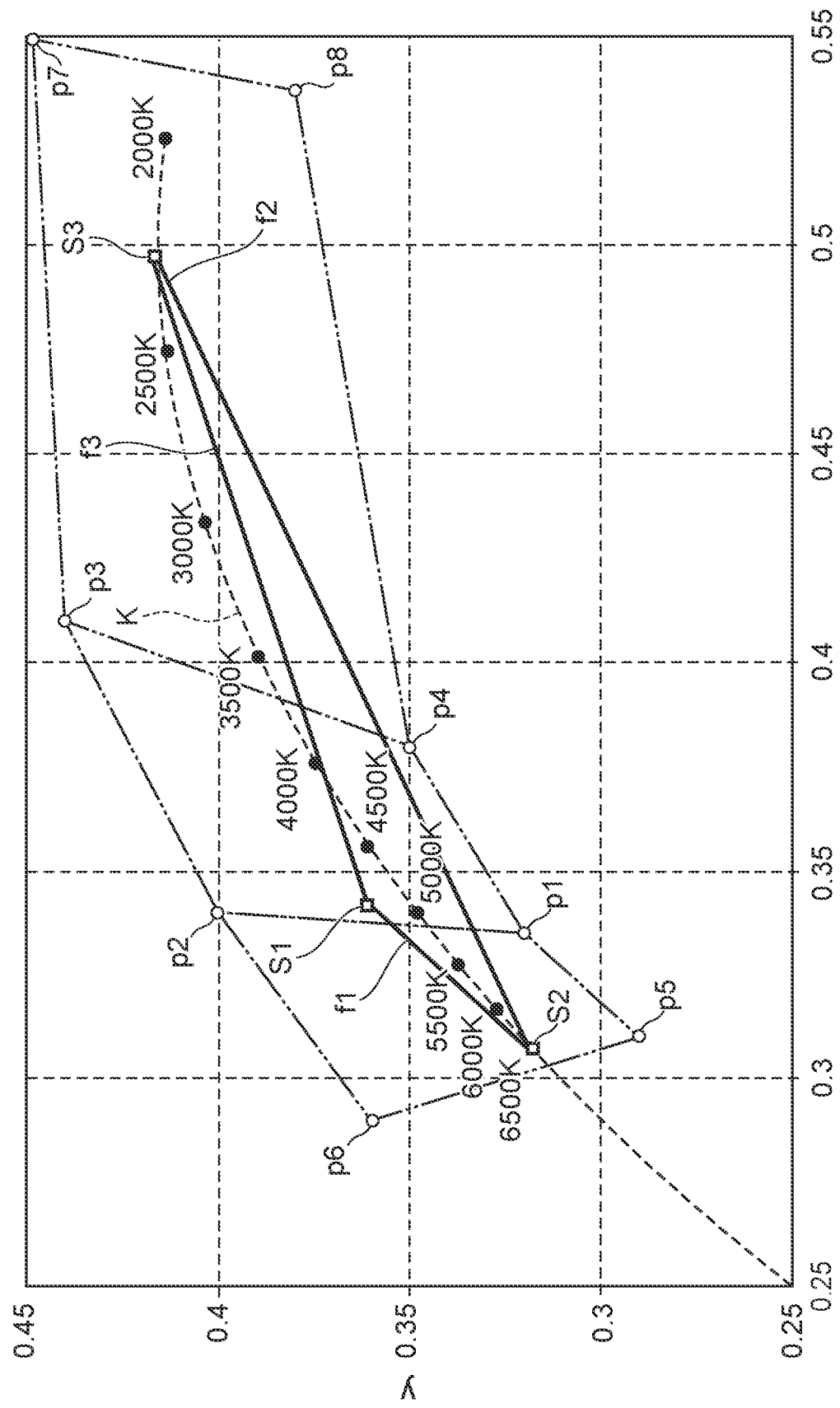
FIG. 7 is a CIE1931 chromaticity diagram plotting the color gamut of the outgoing light from the light emitting module according to the first embodiment.

FIG. 7 is a CIE1931 chromaticity diagram plotting the color gamut of the outgoing light from the light emitting module according to this embodiment.

Hereinafter, the state in which the first light source 110 is turned on while the second light source 130 is turned off at the first position P1 will be referred to as the "first state." Furthermore, the state in which the first light source 110 is turned on while the second light source 130 is turned off at the second position P2 will be referred to as the "second state." The state in which the first light source 110 is turned off while the second light source 130 is turned on at the first position P1 will be referred to as the "third state."

The first state is the state in which the first light source 110 in FIG. 5 is turned on and the second light source 130 is turned off. In this state, the color of the outgoing light Lc from the third face 123 of the first lens 120 is a mixed color of the frontal light La1 and the lateral light La2 of the first light source 110, for example, natural white approximating the midday sun. Because the second light source 130 is off, the outgoing light Le from the light emitting module 100 is composed only of the light Lc. Accordingly, the light Le is, for example, is natural white light. As shown in FIG. 7, the chromaticity Si of the light Le falls, for example, within the area enclosed by the quadrangle that connects the four points in the chromaticity coordinate system: point p1 (x=0.335, y=0.32), point p2 (x=0.34, y=0.4), point p3 (x=0.41, y=0.44), and point p4 (x=0.38, y=0.35). The correlated color temperature of the light Le is, for example, 4500 K.

The second state is the state in which the first light source 110 in FIG. 6 is turned on and the second light source 130 is turned off. In this state, the color of the outgoing light Lc from the third face 123 of the first lens 120 is roughly the same as the color of the frontal light La1 of the first light source 110, for example, bluish daylight white. Because the second light source 130 is off, the outgoing light Le from the light emitting module 100 is composed only of the light Lc. Accordingly, the light Le is daylight white light. As shown in FIG. 7, the chromaticity S2 of the light Le falls, for example, within the area enclosed by the quadrangle that connects the four points in the chromaticity coordinate system: point p5 (x=0.31, y=0.29), point p6 (x=0.29, y=0.36), point p2 (x=0.34, y=0.4), and point p1 (x=0.335, y=0.32). The correlated color temperature of the outgoing light Le from the light emitting module 100 is, for example, 6500 K.

Accordingly, when the first lens 120 is moved from the first position P1 to the second position P2, or from the second position P2 to the first position P1 in the state in which the first light source 110 is on and the second light source 130 is off, the chromaticity of the light Le changes on the straight line f1 connecting the chromaticity S1 and the chromaticity S2 in the chromaticity coordinate system.

The third state is the state in which the first light source 110 in FIG. 5 is turned off. In this state, the color of the outgoing light Ld from the third face 143 of the second lens 140 is, for example, an incandescent light color. Because the first light source 110 is turned off, the outgoing light Le from the light emitting module 100 is composed only of the light Ld. Accordingly, the light Le is, for example, incandescent white light. As shown in FIG. 7, the chromaticity S3 of the light Le falls, for example, within the area enclosed by the quadrangle that connects the four points in the chromaticity coordinate system: point p4 (x=0.38, y=0.35), point p3 (x=0.41, y=0.44), point p7 (x=0.55, y=0.45), and point p8 (x=0.53, y=0.38). The correlated color temperature of the light Le is, for example, 2300 K.

Furthermore, by lighting both the first light source 110 and the second light source 130, the outgoing light Lc from the first lens 120 and the outgoing light Ld from the second lens 140 may be mixed. For example, when the ratio of the output of the first light source 110 to the output of the second light source 130 is changed at the first position P1, the chromaticity of the light Le changes on the straight line f3 connecting the chromaticity S1 and the chromaticity S3 in the chromaticity coordinate system. Specifically, the greater the ratio of the output of the first light source 110 to the output of the second light source 130, the closer the chromaticity to the chromaticity S1 on the straight line f3 becomes, and the greater the ratio of the output of the second light source 130 to the output of the first light source 110, the closer the chromaticity to the chromaticity S3 on the straight line f3 becomes. For example, when the ratio of the output of the first light source 110 to the output of the second light source 130 at the second position P2 is changed at the second position, the chromaticity of the light Le changes on the straight line f2 connecting the chromaticity S2 and the chromaticity S3 in the chromaticity coordinate system. Specifically, the greater the ratio of the output of the first light source 110 to the output of the second light source 130, the closer the chromaticity to the chromaticity S2 on the straight line f2 becomes, and the greater the ratio of the output of the second light source 130 to the output of the first light source 110, the closer the chromaticity to the chromaticity S3 on the straight line f2 becomes.

As such, the chromaticity of the light Le can be changed within the range enclosed by the straight lines f1 to f3 by adjusting the distance between the first light source 110 and the first lens 120, the distance between the second light source 130 and the second lens 140, and the ratio of the output of the first light source to the output of the second light source 130.

Figure 8:
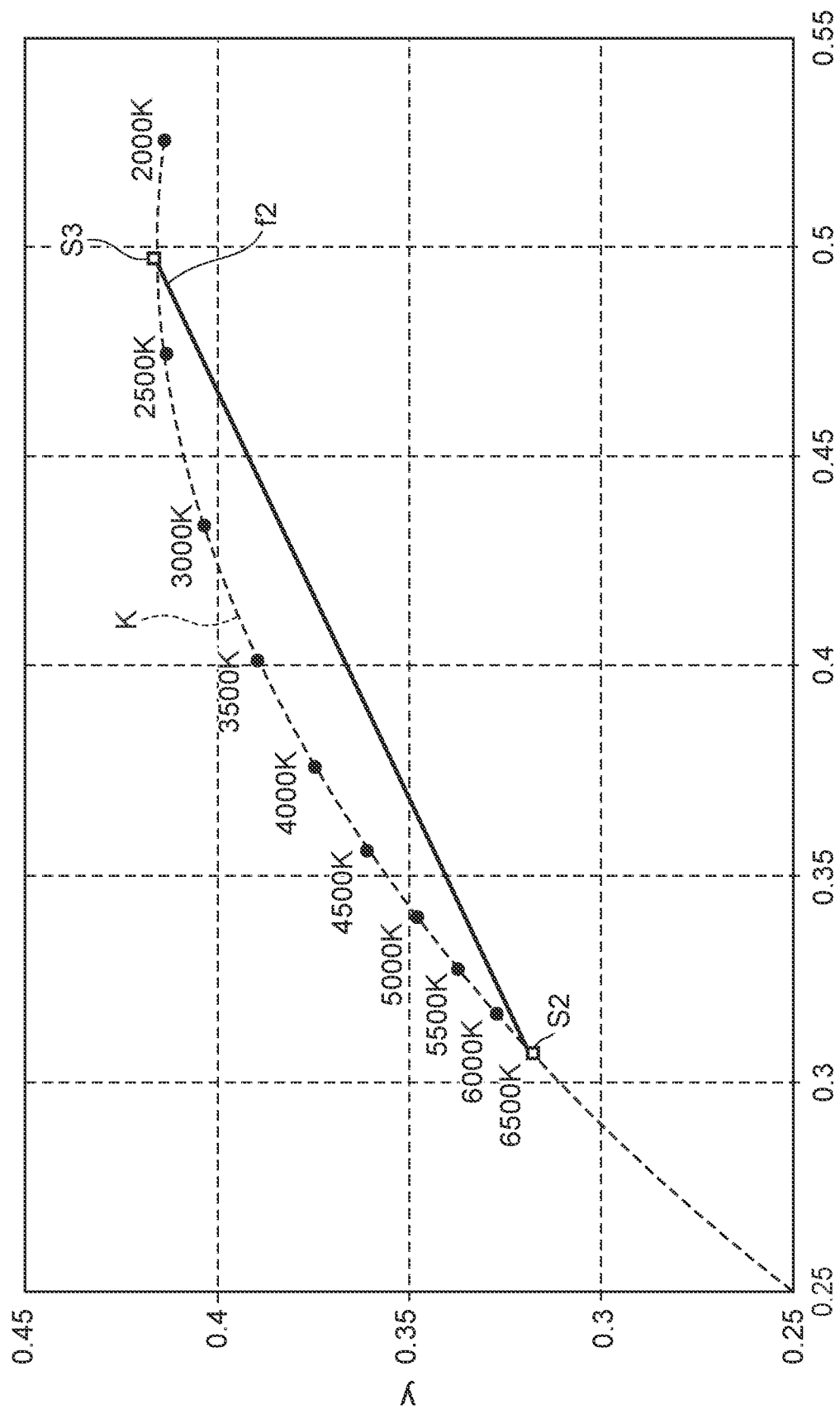
FIG. 8 is a CIE1931 chromaticity diagram plotting the color gamut of the outgoing light from a light emitting module provided as a reference example.

FIG. 8 is a CIE1931 chromaticity diagram plotting the color gamut of the outgoing light from a light emitting module that is a reference example.

The light emitting module of the reference example does not include a drive unit 150, and the first lens 120 and the second lens 140 are fixed at the second position P2. When the second light source 130 is turned on in the state in which the second lens 140 is at the second position P2, the color of the outgoing light Ld from the third face 143 of the second lens 140 is roughly the same as the color of the light Ld in the third state, for example, incandescent white light. Accordingly, the chromaticity of the outgoing light from the light emitting module of the reference example can only be changed on the straight light f2 connecting the chromaticity S2 and the chromaticity S3 by adjusting the ratio of the output of the first light source 110 to the output of the second light source 130. In contrast, the light emitting module 100 according to the present embodiment allows the chromaticity of the outgoing light to be changed in the color gamut enclosed by the straight lines f1 to f3.

As shown in FIG. 7, furthermore, in the case of the present embodiment, the emission color of the light emitting module can be changed at positions near the black body radiation locus as shown by the line segment connecting the chromaticity S1 and the chromaticity S2 and the line segment connecting the chromaticity S1 and the chromaticity S3.

Next, application examples of the light emitting module 100 will be explained.

Figure 9A:
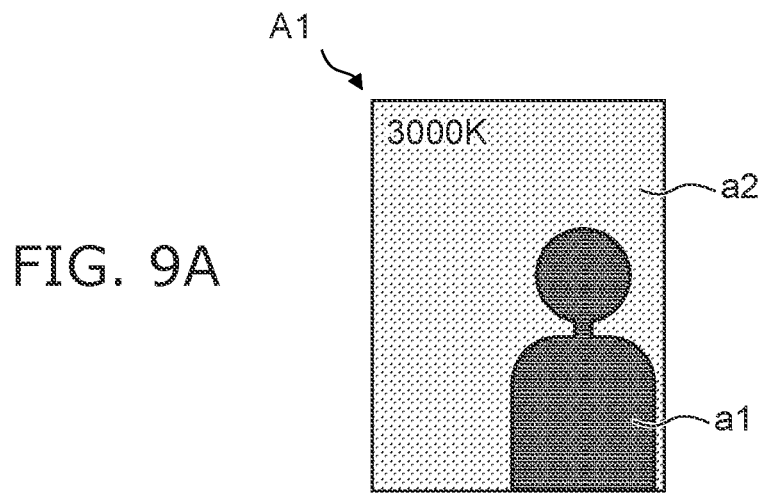
FIG. 9A is an image of a picture taken without flash.

FIG. 9A is an image of a picture taken without flash.

Figure 9B:
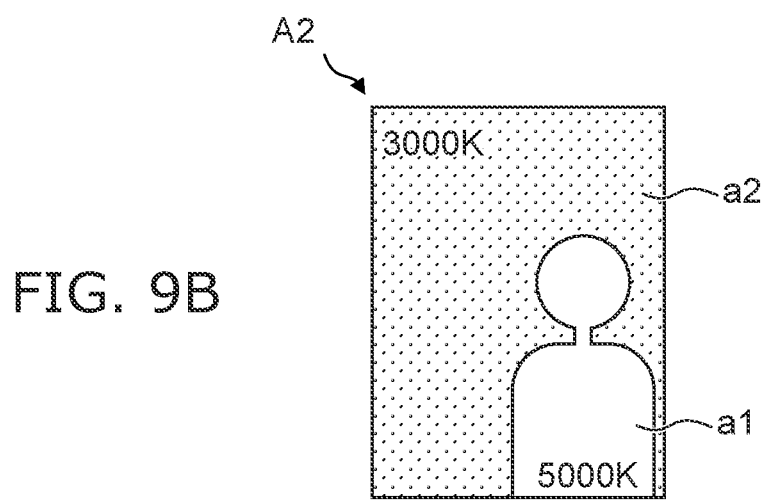
FIG. 9B is an image of a picture taken with flash having a color temperature different from that of the ambient light.

FIG. 9B is an image of a picture taken with flash that has a color temperature different from that of the ambient light.

Figure 9C:
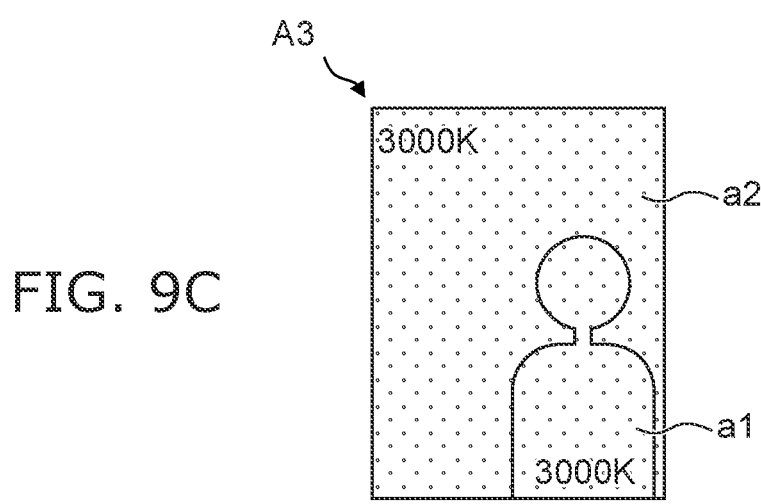
FIG. 9C is an image of a picture taken with flash having a color temperature similar to that of the ambient light.

FIG. 9C is an image of a picture taken with flash that has a color temperature similar to that of the ambient light.

The light emitting module 100 can be applied as a light source for a flash installed in a smartphone, for example.

As shown in FIG. 9A, when taking a picture using a camera with backlight and without flash, the image of the subject a1 captured is darker than the background a2 in the picture A1.

As shown in FIG. 9B, when taking a picture using a camera with flash that has a different color temperature from that of the ambient light, a photograph A2 results in which the correlated color temperature of the flash irradiated against the subject a1 differs from the color temperature of the ambient light. In such a case, a picture A2 can be obtained in which the tint of the subject a1 differs from that of the background a2. FIG. 9B shows an example in which the color temperature of the ambient light is 3000 K and the correlated color temperature of the flash is 5000 K.

When taking a picture using a camera with flash having a color temperature close to the color temperature of the ambient light, as shown in FIG. 9C, a photograph A3 results in which the correlated color temperature of the flash irradiated against the subject a1 is about the same as the color temperature of the ambient light. This can achieve a photograph A3 in which the tint of the subject a1 is roughly the same as that of the background a2. When the ambient light is natural light such as sunlight, in particular, the chromaticity of the ambient light is positioned on the blackbody locus K. Accordingly, allowing the light emitting module 100 to emit light having chromaticity on or near the blackbody locus K can make the correlated color temperature of the flash irradiated against the subject a1 roughly the same as the color temperature of the ambient light. This can achieve a photograph A3 that more naturally captures the image of a subject.

As described above, by using a flash to which the light emitting module of the present embodiment is applied, the color temperature of the flash irradiated against the subject a1 can be changed to a desired color temperature.

Even when a picture is taken without flash as shown in FIG. 9A, the brightness, the chromaticity, and the color temperature can be adjusted by making an image processing correction. However, the electric power and the processing time required by such a correction increase as the image resolution increases. In contrast, the flash employing the light emitting module according to the present embodiment can change the outgoing light from the flash in accordance with the type of picture to be taken. This can reduce the electric power or time used in image processing. Such a light source is particularly suited in capturing a high resolution image. The application of the light emitting module 100 is not particularly limited to flashes.

The effect of the present embodiment will be explained next.

The light emitting module 100 according to this embodiment includes a first light source 110, a first lens 120, a second light source 130, a second lens 140, and a drive unit 150. The first light source 110 has a first light emitting element 111 that emits first light L1, and a first wavelength conversion member 112 that converts the wavelength of a portion of the first light L1 to emit second light L2. The first light source 110 outputs light La that includes the first light L1 and the second light L2. The outgoing light La from the first light source 110 becomes incident on the first lens 120. The second light source 130 outputs light Lb having different chromaticity from that of the outgoing light La from the first light source 110. The outgoing light Lb from the second light source 130 becomes incident on the second lens 140. The drive unit 150 changes the distance between the first lens 120 and the first light source 110 to change the amount of the outgoing second light L2 from the first lens 120.

Changing the distance between the first lens 120 and the first light source 110 in this manner can broaden the color gamut of the outgoing light Lc from the first lens 120. Furthermore, the color gamut of the outgoing light Le from the light emitting module 100 can be further broadened by mixing the outgoing light Lc from the first lens 120 and the outgoing light Ld from the second lens 140. This can achieve a light emitting module 100 capable of changing the chromaticity of the outgoing light Le.

In this embodiment, moreover, the drive unit 150 can further change the distance between the second lens 140 and the second light source 130. The first lens 120 and the second lens 140 are integrally formed. Accordingly, the first lens 120 and the second lens 140 can be moved by using a simplified structure.

The drive unit 150 can move the first lens 120 to a first position P1 and a second position P2 at which the distance between the first lens 120 and the first light source 110 is greater than that at the first position P1. At the first position P1, a portion of the first face 121, the incident face, of the first lens 120 on which the outgoing light La from the first light source 110 becomes incident is positioned laterally outward of the first wavelength conversion member 112. Accordingly, at the first position P1, the lateral light La2 can sufficiently become incident on the first face 121 of the first lens 120. At the second position P2, the amount of the lateral light La2 becoming incident on the first face 121 can be reduced as compared to at the first position P1.

The first lens 120 and the second lens 140, furthermore, are total internal reflection lenses. The total internal reflection lenses 120 and 140 are provided with protrusions 120a and 140b, respectively. Accordingly, the lenses 120 and 140 can easily intake both the frontal light La1 and Lb1 and the lateral light La2 and Lb2, respectively, at the first position P1.

The first wavelength conversion member 112 covers the first light emitting element 111 as well as extending out from the lateral faces of the first light emitting element 111 when viewed from above. This allows the outgoing light La from the first light source 110 to include the frontal light La1 and the lateral light La2, and the difference between the chromaticity of the frontal light La1 and the chromaticity of the lateral light La2 to be increased.

The light emitting module 100 further includes a diffusion sheet that diffuses the outgoing light La from the first lens 120 and the outgoing light Lb from the second lens 140. This can reduce the color nonuniformity of the outgoing light Le from the light emitting module 100.

The output of the first light source 110 and the output of the second light source 130 are independently controllable. Independently controlling the outputs of the first light source 110 and the second light source 130 can further broaden the color gamut of the outgoing light Le from the light emitting module 100.

Second Embodiment

A second embodiment will be explained next.

Figure 10:
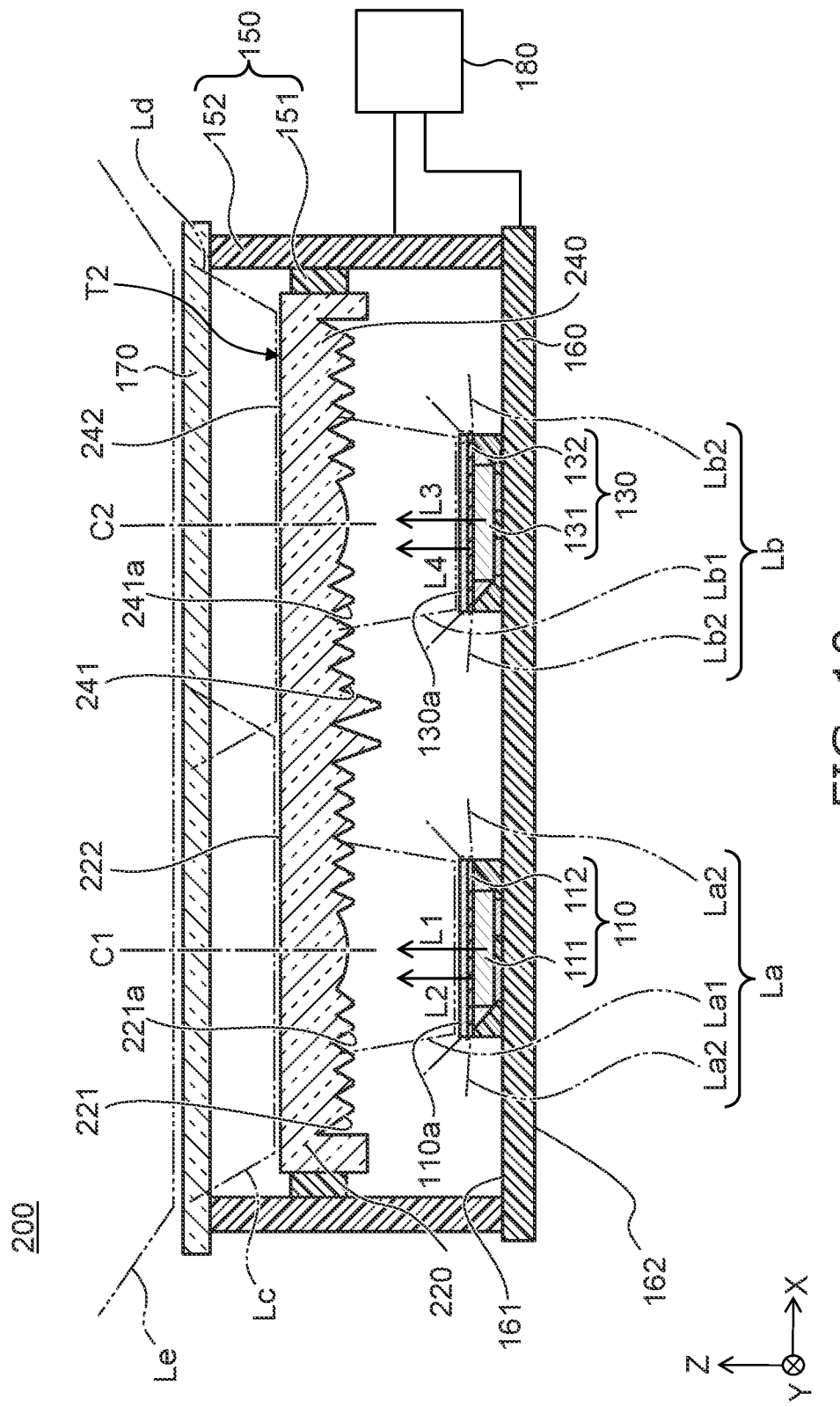
FIG. 10 is a cross-sectional view schematically showing a light emitting module according to a second embodiment.

FIG. 10 FIG. 10 is an end face view of a light emitting module according to this embodiment.

Figure 11A:
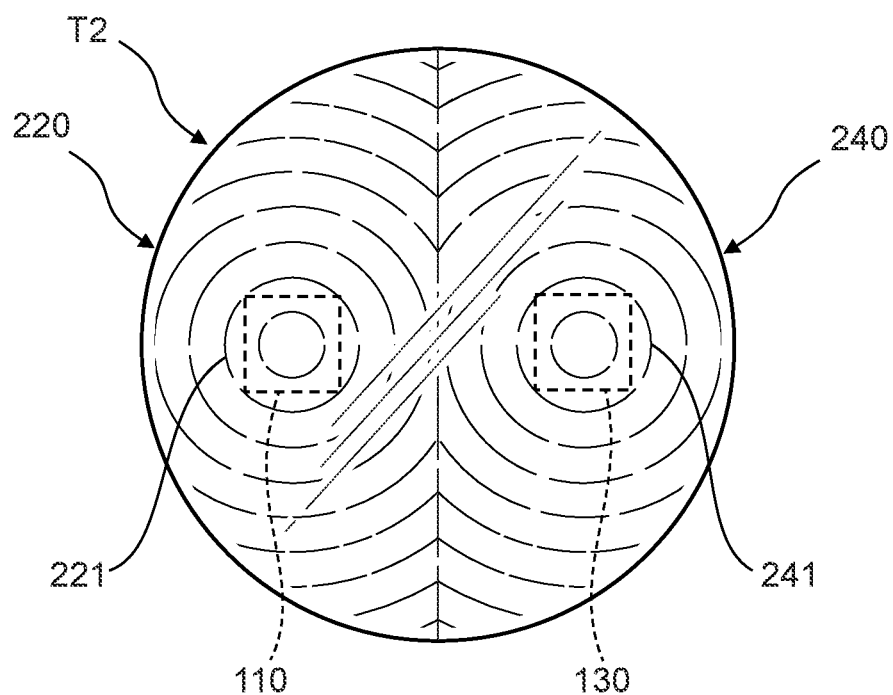
FIG. 11A is a top view schematically showing examples of first and second lenses.

FIG. 11A is a top view of examples of first and second lenses.

Figure 11B:
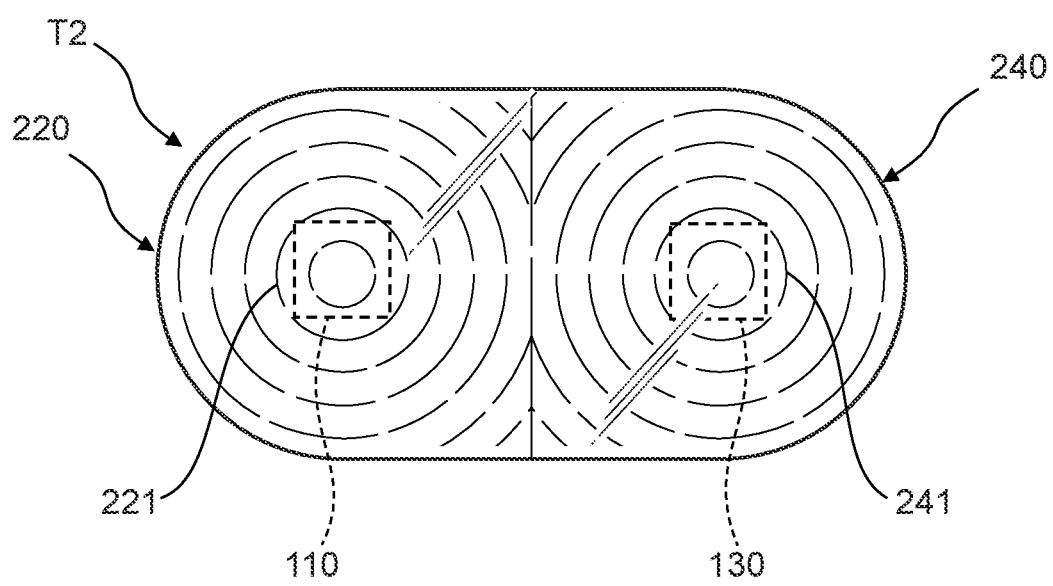
FIG. 11B is a top view schematically showing examples of first and second lenses.

FIG. 11B is a top view of examples of first and second lenses.

A light emitting module 200 according to this embodiment differs from the light emitting module 100 according to the first embodiment in terms of the structures of the first lens 220 and the second lens 240.

In the explanation below, as a basic rule, only the differences from the first embodiment will be described. The other features not described below are similar to those in the first embodiment.

The first lens 220 and the second lens 240 are, for example, Fresnel lenses. The first lens 220 and the second lens 240 are integrally formed and made of a single light transmissive member T2, for example.

The surfaces of the first lens 220 include a first face 221 and a second face 222. The first face 221 is an incident face on which the outgoing light La from the first light source 110 becomes incident. The first face 221 opposes the upper face 110a of the first light source 110. The first face 221 has multiple annular protrusions 221a disposed concentrically around the axis C1, for example. The second face 222 is positioned opposite the first face 221. The second face 222 is, for example, flat and substantially in parallel with the upper face 161 of the substrate 160.

The surfaces of the second lens 240 include a first face 241 and a second face 242. The first face 241 is an incident face on which the outgoing light Lb from the second light source 130 becomes incident. The first face 241 opposes the upper face 130a of the second light source 130. The first face 241 has multiple annular protrusions 241a disposed concentrically around the axis C2, for example. The second face 242 is positioned opposite the first face 241. The second face 242 is, for example, flat and substantially in parallel with the upper face 161 of the substrate 160.

As shown in FIG. 11A and FIG. 11B, when viewed from above, the shape of the light transmissive member T2 may be circular as in FIG. 11A or substantially elliptical as in FIG. 11B.

The effect of this embodiment will be explained next.

The first lens 220 and the second lens 240 in this embodiment are Fresnel lenses. Accordingly, the lenses 220 and 240 are provided with protrusions 221a and 241a, respectively. The lenses 220 and 240 at the first position P1 therefore can sufficiently intake both the frontal light La1 and Lb1 and the lateral light La2 and Lb2.

In each of the first embodiment and the second embodiment, the form in which the drive unit moves both the first and second lenses was explained. The drive unit may be adapted to move only the first lens. Moreover, the first lens and the second lens may be replaced with reflectors.

The present disclosure can be utilized, for example, as a light source for a flash and the like.

What is claimed is:

1. A light emitting module comprising:
a substrate;
a first light source mounted on the substrate, the first light source comprising:
a first light emitting element configured to emit first light,
a light reflecting member surrounding lateral faces of the first light emitting element, and
a first wavelength conversion member configured to convert a wavelength of a portion of the first light and to emit second light, such that the first light source is configured to output light that includes the first light and the second light, the first wavelength conversion member covering the first light emitting element and extending out from the lateral faces of the first light emitting element when viewed from above; and
a first lens on which the light output from the first light source is incident;
wherein:
a proportion of the first light to the second light included in outgoing light from the first lens is variable by changing a distance between the first lens and the first light source,
the light emitting module is configured to move the first lens to a first position and to a second position, wherein a distance between the first lens and the first wavelength conversion member when the first lens is at the second position is greater than a distance between the first lens and the first wavelength conversion member when the first lens is at the first position,
when the first lens is at the first position, a portion of an incident face of the first lens on which the light output from the first light source is incident is located laterally outward of the first wavelength conversion member,
when the first lens is at the first position, a chromaticity of outgoing light from the first lens falls within an area enclosed by a quadrangle connecting four points in the CIE1931 xy chromaticity coordinate system: (x=0.335, y=0.32), (x=0.34, y=0.4), (x=0.41, y=0.44), and (x=0.38, y=0.35), and
when the first lens is at the second position, a chromaticity of the outgoing light from the first lens falls within an area enclosed by a quadrangle connecting four points in the CIE1931 xy chromaticity coordinate system: (x=0.31, y=0.29), (x=0.29, y=0.36), (x=0.34, y=0.4), and (x=0.335, y=0.32).

2. The light emitting module according to claim 1, further comprising:
a second light source mounted on the substrate, the second light source being configured to output light having a chromaticity that is different from a chromaticity of the light output from the first light source; and
a second lens on which the light output from the second light source is incident.

3. The light emitting module according to claim 1, wherein the first lens is a total internal reflection lens.

4. The light emitting module according to claim 1, wherein the first lens is a Fresnel lens.

5. The light emitting module according to claim 1, wherein the first wavelength conversion member has a constant thickness.

6. The light emitting module according to claim 1 further comprising a diffusion sheet configured to diffuse outgoing light from the first lens.

7. The light emitting module according to claim 2, wherein the first lens and the second lens are integrally formed.

8. The light emitting module according to claim 2, wherein the second light source comprises a second light emitting element configured to emit third light, and a second wavelength conversion member configured to convert a wavelength of a portion of the third light and to emit fourth light.

9. The light emitting module according to claim 2, wherein an output of the first light source and an output of the second light source are independently controllable.

10. The light emitting module according to claim 2, wherein the second lens is a total internal reflection lens.

11. The light emitting module according to claim 2, wherein the second lens is a Fresnel lens.

12. The light emitting module according to claim 2, wherein a chromaticity of outgoing light from the second lens falls within an area enclosed by a quadrangle connecting four points in the CIE1931 xy chromaticity coordinate system: (x=0.38, y=0.35), (x=0.41, y=0.44), (x=0.55, y=0.45), and (x=0.53, y=0.38).

13. The light emitting module according to claim 8, wherein:
the light output from the second light source includes the third light and the fourth light; and
the light emitting module is configured to change a distance between the second lens and the second light source so as to change a chromaticity of outgoing light from the second lens.

* * * * *